(12) United States Patent
Matsubara et al.

(10) Patent No.: US 9,357,677 B2
(45) Date of Patent: May 31, 2016

(54) ELECTRONIC DEVICE WITH EFFICIENT HEAT RADIATION STRUCTURE FOR ELECTRONIC COMPONENTS

(71) Applicant: PANASONIC INTELLECTUAL PROPERTY MANAGEMENT CO., LTD., Osaka (JP)

(72) Inventors: Ryo Matsubara, Osaka (JP); Hiroyoshi Umeda, Osaka (JP); Atsushi Sakae, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 308 days.

(21) Appl. No.: 14/032,660

(22) Filed: Sep. 20, 2013

(65) Prior Publication Data

US 2014/0085832 A1    Mar. 27, 2014

Related U.S. Application Data

(63) Continuation of application No. PCT/JP2013/001717, filed on Mar. 14, 2013.

(30) Foreign Application Priority Data

Sep. 26, 2012    (JP) ................................ 2012-211836

(51) Int. Cl.
*H05K 7/20*    (2006.01)
*G02F 1/1333*    (2006.01)
*H01L 23/473*    (2006.01)

(52) U.S. Cl.
CPC ........ *H05K 7/2039* (2013.01); *G02F 1/133385* (2013.01); *H05K 7/20436* (2013.01); *H05K 7/20445* (2013.01); *H05K 7/20963* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 6,330,167 B1 * 12/2001 Kobayashi ........... H05K 9/0028
                                                    174/377
7,679,903 B2    3/2010 Takayanagi et al.
(Continued)

FOREIGN PATENT DOCUMENTS

JP    4-79490    7/1992
JP    2001-15656    1/2001
(Continued)

OTHER PUBLICATIONS

International Search Report (ISR) issued Jun. 18, 2013 in International (PCT) Application No. PCT/JP2013/001717.
(Continued)

*Primary Examiner* — Anthony Haughton
*Assistant Examiner* — Razmeen Gafur
(74) *Attorney, Agent, or Firm* — Wenderoth, Lind & Ponack, L.L.P.

(57) ABSTRACT

An electronic device includes a metallic body, a circuit substrate having electronic components and wiring conductors, a heat conduction member that absorbs a heat generated by the electronic components, and a heat radiation member provided between the metallic body and the heat conduction member. The heat radiation member includes a heat introduction portion surface-contacted with the heat conduction member, a heat discharge portion surface-contacted with the metallic body, and a heat conduction portion that conducts the heat from the heat introduction portion to the heat discharge portion. The heat conduction portion is provided to be separated from the wiring conductors so as not to electromagnetically couple to the wiring conductors.

9 Claims, 10 Drawing Sheets

(56) References Cited

U.S. PATENT DOCUMENTS

| | | | |
|---|---|---|---|
| 7,969,719 B2 | 6/2011 | Chang et al. | |
| 2002/0149913 A1* | 10/2002 | Nakamura | G06F 1/1616 361/704 |
| 2006/0077619 A1* | 4/2006 | Kim | H05K 1/0204 361/679.21 |
| 2006/0203143 A1* | 9/2006 | Shin | G02F 1/133382 349/58 |
| 2006/0268511 A1* | 11/2006 | Jeong | H05K 7/20963 361/690 |
| 2008/0043444 A1* | 2/2008 | Hasegawa | H01L 33/642 361/717 |
| 2008/0187303 A1* | 8/2008 | Ito | G03B 15/05 396/155 |
| 2008/0259568 A1 | 10/2008 | Takayanagi et al. | |
| 2008/0278918 A1* | 11/2008 | Tominaga | B62D 5/0406 361/719 |
| 2010/0002397 A1* | 1/2010 | Toh | H01L 23/4006 361/713 |
| 2010/0142153 A1* | 6/2010 | Ho | H01L 23/3677 361/710 |
| 2010/0142155 A1* | 6/2010 | Mertol | H01L 23/055 361/719 |
| 2010/0165574 A1* | 7/2010 | Iwata | H05K 7/20981 361/699 |
| 2010/0321895 A1* | 12/2010 | Hill | H05K 7/20472 361/715 |
| 2011/0096504 A1* | 4/2011 | Hild | H01L 51/5237 361/704 |
| 2011/0103013 A1* | 5/2011 | Furukawa | H04N 5/64 361/695 |
| 2011/0110031 A1* | 5/2011 | Homer | G06F 1/20 361/679.54 |
| 2011/0128707 A1* | 6/2011 | Rozman | H01L 23/24 361/709 |
| 2011/0255247 A1* | 10/2011 | Chu | H01L 23/4093 361/709 |
| 2011/0261535 A1* | 10/2011 | Izutani | H01L 23/36 361/708 |
| 2012/0170210 A1* | 7/2012 | Kim | F28D 15/02 361/690 |
| 2012/0281360 A1* | 11/2012 | Nicol | H05K 7/20127 361/704 |
| 2012/0281364 A1* | 11/2012 | Gunderson | H05K 5/0256 361/714 |
| 2012/0287576 A1* | 11/2012 | Takatsuka | H05K 7/209 361/690 |
| 2012/0300402 A1* | 11/2012 | Vos | H01L 23/427 361/701 |
| 2012/0307501 A1* | 12/2012 | Tankala | F21K 9/90 362/294 |

FOREIGN PATENT DOCUMENTS

| | | |
|---|---|---|
| JP | 2005-101194 | 4/2005 |
| JP | 2005-114851 | 4/2005 |
| JP | 2006-514429 | 4/2006 |
| JP | 2007-59231 | 3/2007 |
| JP | 2008-268655 | 11/2008 |
| JP | 2010-62583 | 3/2010 |
| JP | 2010-258474 | 11/2010 |
| JP | 2011-23647 | 2/2011 |
| JP | 2011-186319 | 9/2011 |
| JP | 2012-69902 | 4/2012 |
| JP | 2012-84599 | 4/2012 |
| JP | 2012-146778 | 8/2012 |
| WO | 2004/068920 | 8/2004 |

OTHER PUBLICATIONS

Japanese Office Action (OA) issued Sep. 2, 2014 in corresponding Japanese Patent Application No. 2013-535184.

English translations of the International Preliminary Report on Patentability and Written Opinion issued Apr. 9, 2015 in International (PCT) Application No. PCT/JP2013/001717.

* cited by examiner

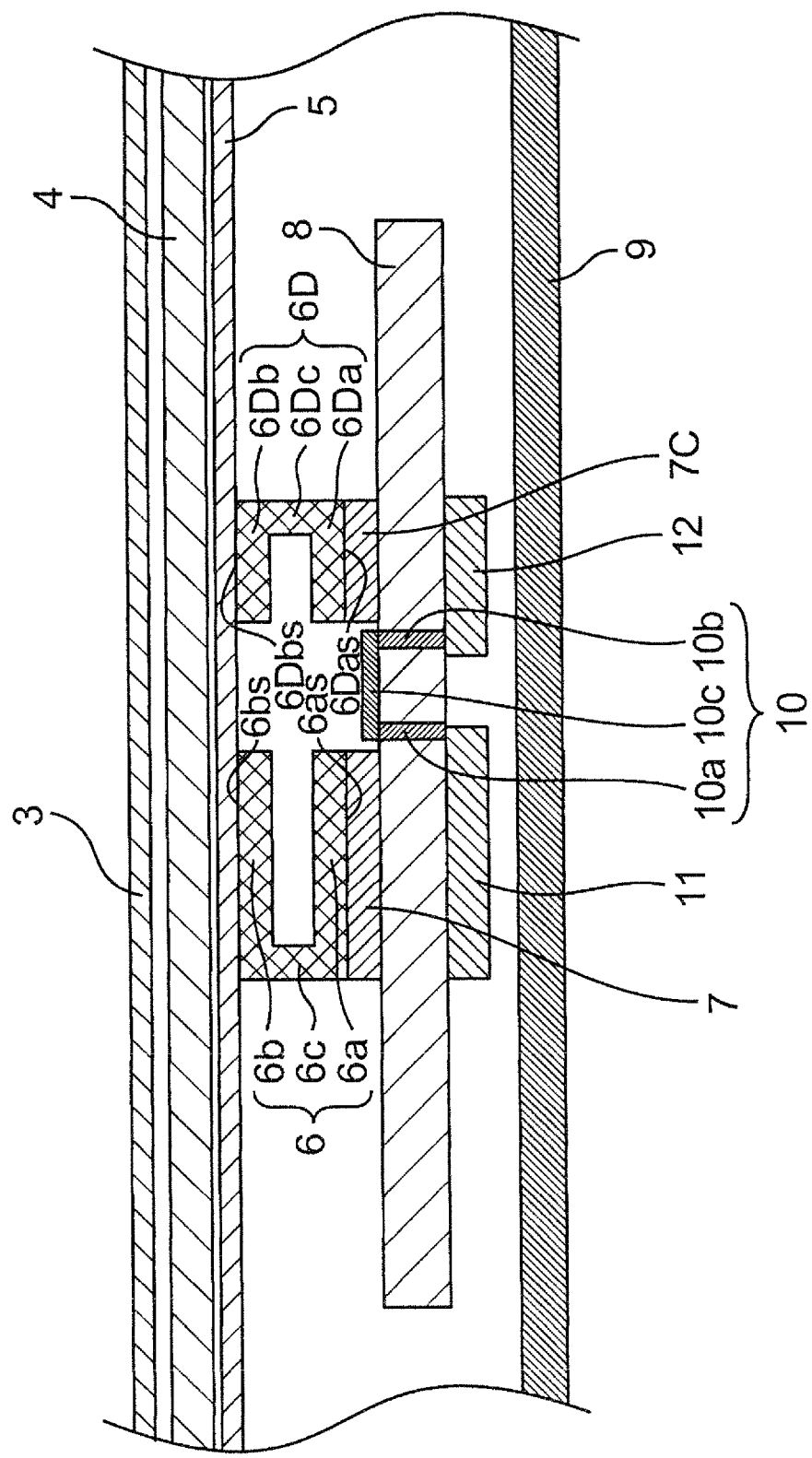

ELECTRONIC DEVICE WITH EFFICIENT HEAT RADIATION STRUCTURE FOR ELECTRONIC COMPONENTS

CROSS-REFERENCE TO RELATED APPLICATIONS

This is a continuation application of International Application No. PCT/JP2013/001717, with an international filing date of Mar. 14, 2013, which claims priority of Japanese Patent Application No. JP2012-211836 filed on Sep. 26, 2012, the content of which is incorporated herein by reference.

BACKGROUND OF THE INVENTION

1. Field of the Invention

The present disclosure relates to a heat radiation structure of an electronic device.

2. Description of the Related Art

According to Patent Literature 1 of Japanese Patent Laid-open Publication No. JP2011-23647 A, there is a description of an electronic device having a circuit substrate implemented by elements, which generates a heat. In this electronic device, a frame member connected to the circuit substrate is connected and fixed to a plate member, which has a thermal conductivity higher than that of the frame member, and the plate member is inserted between exterior members, each of which has the thermal conductivity lower than that of the plate member, and this electronic device is fixed to the frame member. Accordingly, it is possible to efficiently disperse the heat to the back side of the circuit substrate, without conducting the heat directly to the exterior member, where the heat is generated due to temperature increase of the elements on the circuit substrate.

SUMMARY OF THE INVENTION

The present disclosure provides an electronic device for efficiently radiating a heat, which is generated by an electronic component implemented on a circuit substrate.

An electronic device according to the present disclosure includes a metallic body, a circuit substrate having electronic components and wiring conductors, a heat conduction member configured to absorb a heat generated by the electronic component, and a heat radiation member provided between the metallic body and the heat conduction member. The heat radiation member includes a heat introduction portion surface-contacted with the heat conduction member, a heat discharge portion surface-contacted with the metallic body, and a heat conduction portion configured to conduct the heat from the heat introduction portion to the heat discharge portion. The heat conduction portion is provided to be separated from the wiring conductor so as not to electromagnetically couple to the wiring conductor.

According to the electronic device in the present disclose, it is possible to efficiently radiate the heat generated by the electronic component implemented on the circuit substrate, as well as to reduce radiation of noise generated on the circuit substrate.

BRIEF DESCRIPTION OF THE DRAWINGS

FIG. 10 is a vertical cross-section diagram of a thin display apparatus 1E according to the other embodiment.

DETAILED DESCRIPTION OF THE PREFERRED EMBODIMENTS

Embodiments of the present disclosure will be described in detail below with reference to the drawings. However, we may omit explanations more detailed than required. For example, we may omit overlap explanations for detailed descriptions of well-known matters and substantially identical configurations. Accordingly, the following explanation can avoid becoming redundant needlessly, and can be easily understood by those skilled in the art.

In addition, since the present inventors provide the following explanation and the accompanying drawings so that the present disclosure can be completely understood by those skilled in the art, subject matters described in claims should not be intentionally limited by the following explanation and the accompanying drawings.

First Embodiment

The first embodiment is described below with reference to FIGS. 1 and 2.

[1-1. Configuration of Thin Display Apparatus]

Figure 1:
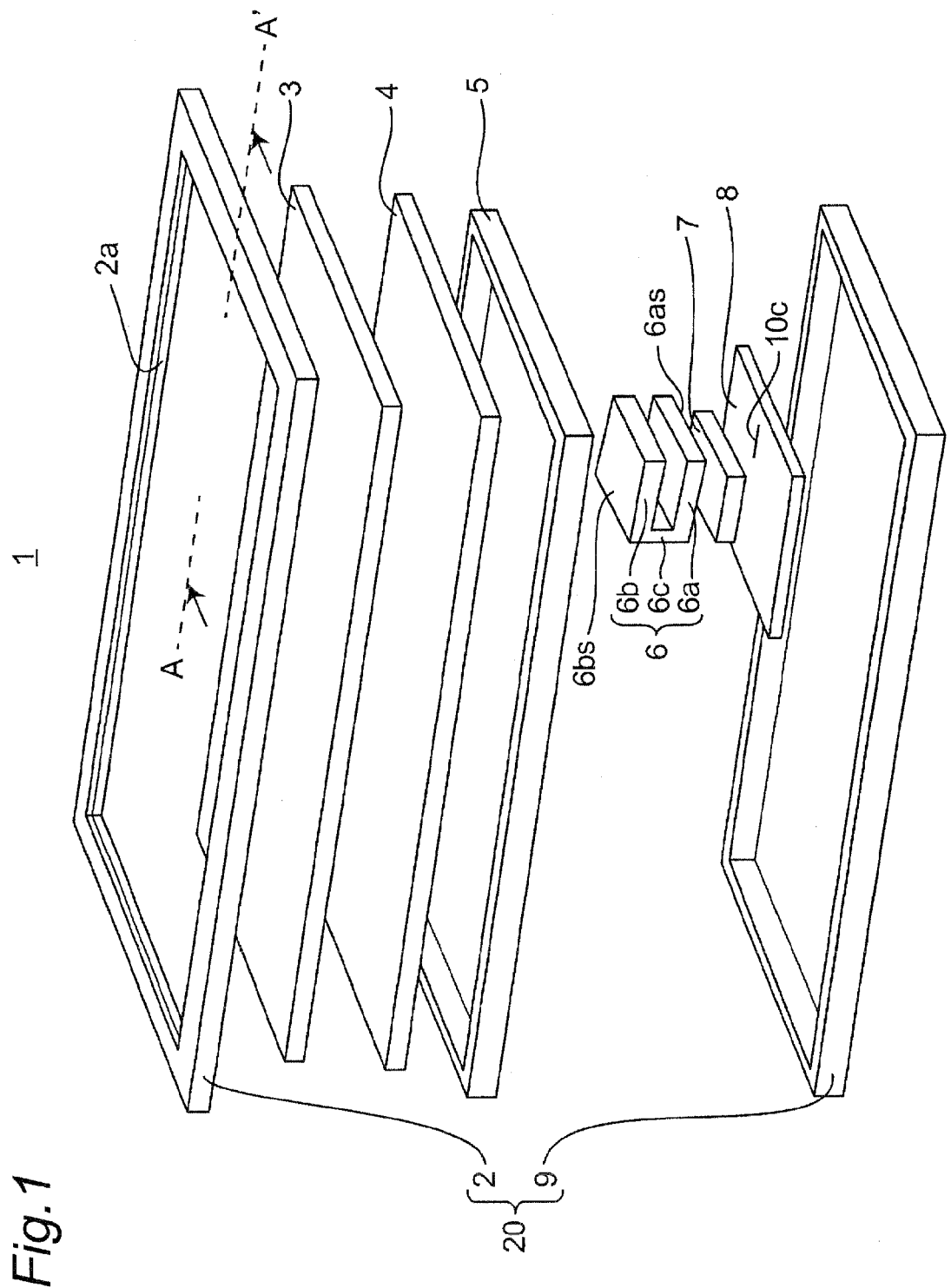
FIG. 1 is an exploded perspective diagram showing a schematic overall configuration of a thin display apparatus 1 according to a first embodiment.

FIG. 1 is an exploded perspective diagram showing a schematic overall configuration of a thin display apparatus 1 according to a first embodiment. The thin display apparatus 1 according to the present embodiment is an electronic device, which is a thin-typed display apparatus.

As long as they are not especially referred to, the terms of "position" and "direction" are defined as follows. Referring to FIG. 1, the terms of "front face" and "back face" are expressed on the basis of a liquid crystal display panel 3. That is, a side where an image is displayed within an image display area of the liquid crystal display panel 3 is defined as a "front face", and the side opposite to the "front face" is defined as a "back face". The terms of "top" and "bottom" are expressed on the basis of a direction looking from the front side of the liquid crystal display panel 3 upon using the thin display apparatus.

Referring to FIG. 1, the thin display apparatus 1 is configured to include the liquid crystal display panel 3 of a flat type display panel, a backlight apparatus 4, a metallic chassis 5, a circuit substrate 8, which has a plurality of electronic components such as a driver circuit and a memory for displaying the image on the liquid crystal display panel 3, a heat radiation member 6, a heat conduction member 7, and an enclosure 20.

The enclosure 20 of FIG. 1 is configured to include a front cover 2, and a back cover 9. The liquid crystal display panel 3, the backlight apparatus 4, the metallic chassis 5, the heat radiation member 6, the heat conduction member 7, and the circuit substrate 8 are accommodated in the enclosure 20. The front cover 2 is made to include materials such as a resin and a metal, is provided on the front side of the thin display apparatus 1, and has an aperture 2a. The back cover 9 is made to include materials such as a plastic resin, a metal, to both sides of which high radioactive ceramic sheets are adhered, an alumite-treated black metal, a metal, to which a carbon black is applied, and the like. The back cover 9 is provided on the back side of the thin display apparatus 1. For example, the metal as described above is an alloy including aluminium, iron, and the like as main components.

As described in FIG. 1, the metallic chassis 5 is arranged on the back face of the backlight apparatus 4. In addition, the heat conduction member 7 and the heat radiation member 6 are arranged between the metallic chassis 5 and the circuit substrate 8 for radiating the heat generated by the electronic components implemented on the circuit substrate 8. In FIG. 1, for the purpose of easily understanding an overall structure, a structure of each of the elements is shown to be simplified.

The liquid crystal display panel 3 of FIG. 1 is configured to include horizontal and vertical direction filters, a glass substrate, and an orientation layer liquid crystal, and is provided on the front side of the backlight apparatus 4 and on the back side of the front cover 2. The image display area for displaying the image is configured on the front side of the liquid crystal display panel 3, and the image display area is revealed from the aperture 2a of the front cover 2. The backlight apparatus 4 is provided with a light source of a LED (Light Emitting Diode), a fluorescent tube, and the like.

The metallic chassis 5 of FIG. 1 is configured to include a metal material having a high thermal conductivity and a high electrical conductivity such as iron and aluminium. The metallic chassis 5 holds the liquid crystal display panel 3 and the backlight apparatus 4 by joining the liquid crystal display panel 3 and the backlight apparatus 4 to the metallic chassis 5 using a junction member. The metallic chassis 5 serves as a chassis for holding components of the liquid crystal display panel 3, the backlight apparatus 4, and the like. Simultaneously, the metallic chassis 5 serves as a radiator plate, which is a metallic body for radiating the heat generated by the electronic components implemented on the circuit substrate 8.

The circuit substrate 8 is made of a metal material such as copper. The plurality of electronic components such as the driver circuit, a signal processing circuit, and the memory for driving the liquid crystal display panel 3 are arranged on the back side of the circuit substrate 8. Additionally, referring to FIG. 1, a connection conductor 10c of a portion of a wiring conductor, which electrically connects between the plurality of electronic components, is provided on the front side of the circuit substrate 8.

The heat conduction member 7 of FIG. 1 is made of a material such as a heat radiation rubber, and is arranged so as to be surface-contacted with the front face of the circuit substrate 8.

The heat radiation member 6 of FIG. 1 is made of the metal material having high thermal conductivity and high electrical conductivity such as iron and aluminium. The heat radiation member 6 is configured to include a heat introduction portion 6a having a heat introduction surface 6as surface-contacted with the front face of the heat conduction member 7, a heat discharge portion 6b having a heat discharge surface 6bs surface-contacted with the back face of the metallic chassis 5, and a heat conduction portion 6c provided between the heat introduction portion 6a and the heat discharge portion 6b. As described in FIG. 1, the heat introduction portion 6a and the heat discharge portion 6b, each of which has a flat-plate shape, are arranged in parallel with each other. The heat conduction portion 6c is provided so that the heat introduction portion 6a, the heat discharge portion 6b, and the heat conduction portion 6c form one side face of the heat radiation member 6. The heat radiation member 6 is joined to the front face of the heat conduction member 7 so that the heat introduction surface 6as of the heat introduction portion 6a is surface-contacted with the front face of the heat conduction member 7, and the heat radiation member 6 is joined to the back face of the metallic chassis 5 so that the heat discharge surface 6bs of the heat discharge portion 6b is surface-contacted with the back face of the metallic chassis 5.

Arrangement configurations of the circuit substrate 8, the heat radiation member 6, and the heat conduction member 7 are described in detail below.

Figure 2:
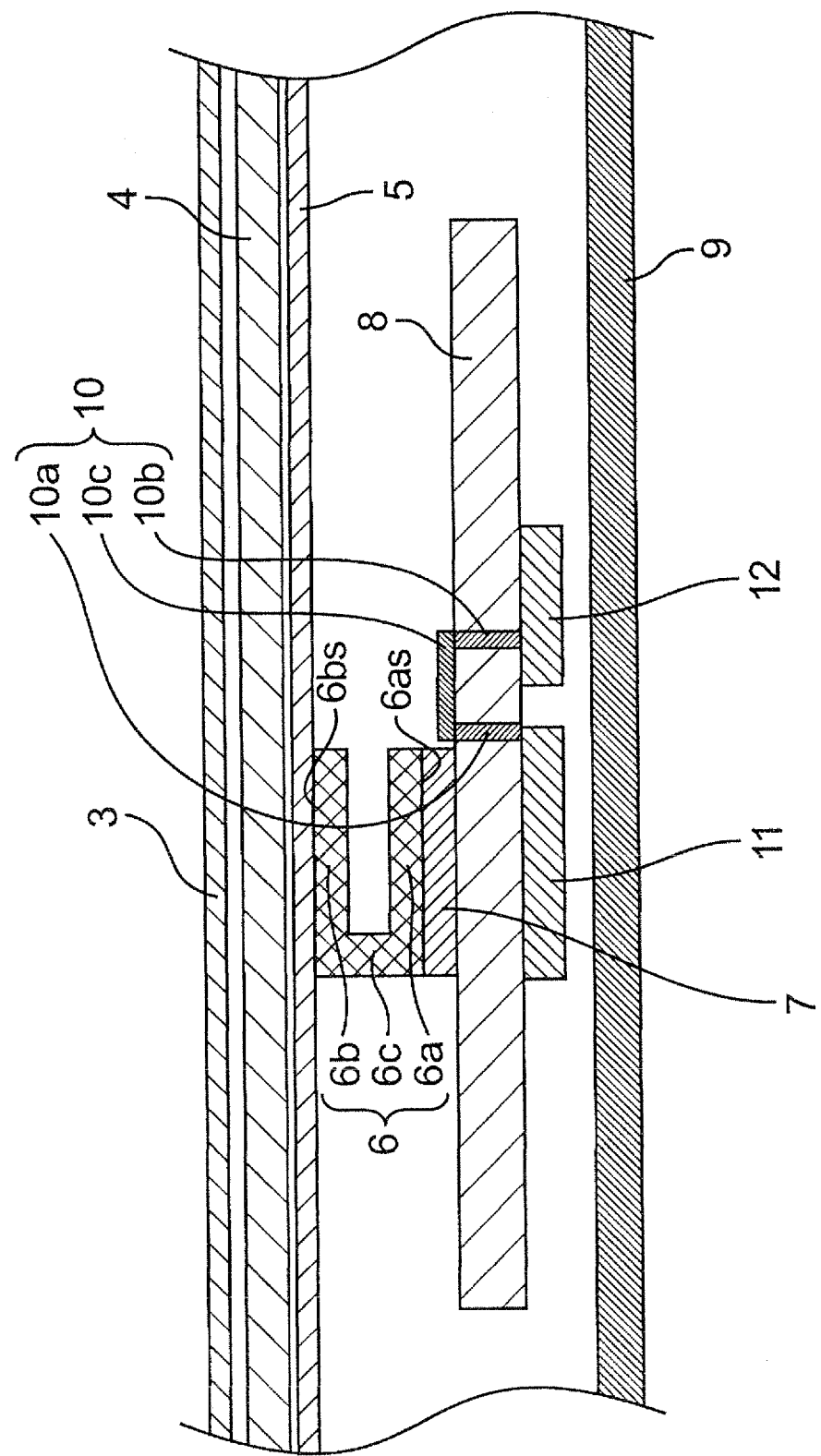
FIG. 2 is a cross-section diagram along A-A' line of the thin display apparatus 1 of FIG. 1.

FIG. 2 is a cross-section diagram along A-A' line of the thin display apparatus 1 of FIG. 1.

Referring to FIG. 2, two electronic components 11 and 12 are arranged on the back face of the circuit substrate 8. A thermal amount generated by the electronic component 11 is relatively large among the plurality of electronic components arranged on the circuit substrate 8, and is larger than the thermal amount generated by the electronic component 12.

The wiring conductor 10 of FIG. 2 is configured to include two via conductors 10a and 10b, the connection conductor 10c. Each of the via conductors 10a and 10b is configured to pass through the circuit substrate 8 via the front and back faces of the circuit substrate 8. The via conductor 10a connects the electronic component 11 to the wiring conductor 10c, and the via conductor 10b connects the electronic component 12 to the wiring conductor 10c. As a result, the electronic component 11 and the electronic component 12 are electrically connected to each other via the wiring conductor 10, and signals can be transmitted via the wiring conductor 10. The electronic component 11, the electronic component 12, and the wiring conductor 10 are electromagnetic noise sources, which generate electromagnetic noises.

As illustrated in FIG. 2, the heat conduction member 7 is arranged in the circuit substrate 8 on the side opposite to the electronic component 11, and back face of the heat conduction member 7 is surface-contacted with the front face of the circuit substrate 8. When looking from the upper side of the circuit substrate 8, the surface-contacted area approximately coincides with the area opposite to the area where the electronic component 11 is arranged. The heat radiation member 6 is arranged so that the heat conduction portion 6c is provided at the position separated from the wiring conductor 10 so as to suppress an electromagnetic coupling to the wiring conductor 10 generating the electromagnetic noise, or so as to suppress a coupling of the heat radiation member 6 to the electromagnetic noise from the wiring conductor 10.

The heat conduction member 7 is arranged in the circuit substrate 8 on the side opposite to the electronic component 11, and therefore, the heat conduction member 7 can efficiently absorb the heat generated by the electronic component 11. The heat radiation member 6 is arranged between the metallic chassis 5 and the heat conduction member 7. As illustrated in FIG. 2, the heat radiation member 6 according to the present embodiment is formed so that a vertical cross-section of the heat radiation member 6 becomes approximately U-shaped. The heat radiation member 6 conducts the heat to the metallic chassis 5, where the heat is conducted from the heat conduction member 7.

[1-2. Operation]

In the thin display apparatus 1 as configured above, a heat radiation of the heat generated by the electronic component 11 and a suppression of the electromagnetic noise radiation from the wiring conductor 10 are described in order below.

The heat radiation of the heat generated by the electronic component 11 is described. Upon activating the thin display apparatus 1, the electronic component 11, which is arranged on the back face of the circuit substrate 8, generates the heat. The back side of the heat conduction member 7 is surface-contacted with the area opposite to the area where the electronic component 11 is arranged, and therefore, the heat generated by the electronic component 11 is conducted to the heat conduction member 7 via the circuit substrate 8. That is, the heat conduction member 7 indirectly absorbs the heat generated by the electronic component 11 via the circuit substrate 8. The heat, which is absorbed in the heat conduction member 7, is conducted to the heat introduction portion 6a via the front face and the heat introduction surface 6as of the heat conduction member 7, and thereafter, the heat is conducted to the heat discharge portion 6b via the heat conduction portion 6c of the heat radiation member 6. The heat, which is conducted to the heat discharge portion 6b, is conducted to the metallic chassis 5 via the heat discharge surface 6bs, and thereafter, the metallic chassis 5 radiates the heat.

In the thin display apparatus 1 according to the present embodiment, the suppression of the electromagnetic noise radiation from the wiring conductor 10 is described below.

When the heat conduction portion 6c of the heat radiation member 6 is arranged near the electromagnetic noise sources, the heat conduction portion 6c is electromagnetically coupled to the wiring conductor 10, which is a generation source of the electromagnetic noise, and therefore, the electromagnetic noise is radiated from the heat radiation member 6. The electromagnetic noise radiated from the heat radiation member 6 is propagated to the metallic chassis 5, and thereafter, the electromagnetic noise is radiated to the outside of the thin display apparatus 1. The electromagnetic noise has a negative impact on the thin display apparatus 1 itself and its surrounding devices, where the electromagnetic noise is radiated and fried out to the outside of the thin display apparatus 1.

In contrast, as described with reference to FIG. 2, the heat radiation member 6 of the present disclosure is formed so that a vertical cross-section of the heat radiation member 6 becomes approximately U-shaped so as to suppress the electromagnetic coupling to the wiring conductor 10, which is the electromagnetic noise source. That is, in order to suppress the electromagnetic coupling between the heat radiation member 6 and the wiring conductor 10, which is the generation source of the electromagnetic noise, the heat conduction portion 6c is provided at the position separated from the wiring conductor 10, which is the electromagnetic noise source. That is, the heat conduction portion 6c is provided at the position, which is not close to the wiring conductor 10. According to the thin display apparatus 1 as configured above, it is possible to suppress the propagation of the electromagnetic noise generated by the wiring conductor 10 to the metallic chassis 5 via the heat radiation member 6. As a result, the electromagnetic noise, which is radiated from the metallic chassis 5, can be suppressed.

[1-3. Advantageous Effects and the Like]

According to the thin display apparatus 1, which is configured as described above, the thin display apparatus 1 is configured to include the metallic chassis 5, the circuit substrate 8 having the electronic component 11 and the wiring conductor 10, the heat conduction member 7 for absorbing the heat generated by the electronic component 11, and the heat radiation member 6 provided between the metallic chassis 5 and the heat conduction member 7. In addition, the heat radiation member 6 is configured to include the heat introduction portion 6a surface-contacted with the heat conduction member 7, the heat discharge portion 6b surface-contacted with the metallic chassis 5, and the heat conduction portion 6c for conducting the heat from the heat introduction portion 6a to the heat discharge portion 6b. Further, the heat conduction portion 6c is provided to be separated from the wiring conductor 10 so as not to electromagnetically couple to the wiring conductor 10.

Accordingly, the thin display apparatus 1 can suppress the electromagnetic coupling of the heat radiation member 6 to the wiring conductor 10 generating the electromagnetic noise. Accordingly, the thin display apparatus 1 can suppress a radiation of the electromagnetic noise from the heat radiation member 6, and therefore, the thin display apparatus 1 can suppress the propagation of the electromagnetic noise radiated from the heat radiation member 6 to the metallic chassis 5 and the liquid crystal display panel 3. In addition, the thin display apparatus 1 can suppress the radiation of the electromagnetic noise from the metallic chassis 5, the liquid crystal display panel 3, and the like. As a result, the thin display apparatus 1 can suppress the radiation of the electromagnetic noise from the thin display apparatus 1 to the outside thereof.

In addition, there is a case that only the heat conduction member 7 is used as a heat radiation structure without using the heat radiation member 6. In this case, when a thickness of the heat conduction member 7 is increased in order to efficiently conduct the heat from the heat conduction member 7 to the metallic chassis 5, there is a possibility that it is difficult to thin the thin display apparatus 1. In contrast, according to the thin display apparatus 1 using both the heat conduction member 7 and the heat radiation member 6 as the heat radiation structure, as compared with the case using only the heat conduction member 7 as the heat radiation structure, the thin display apparatus 1 can use the heat conduction member 7, which is thin in thickness. Therefore, the thin display apparatus 1 has an advantageous effect of reducing a space for providing the heat conduction member 7 and the heat radiation member 6.

Second Embodiment

The second embodiment is described below with reference to FIGS. 3 and 4.

[2-1. Configuration]

Figure 3:
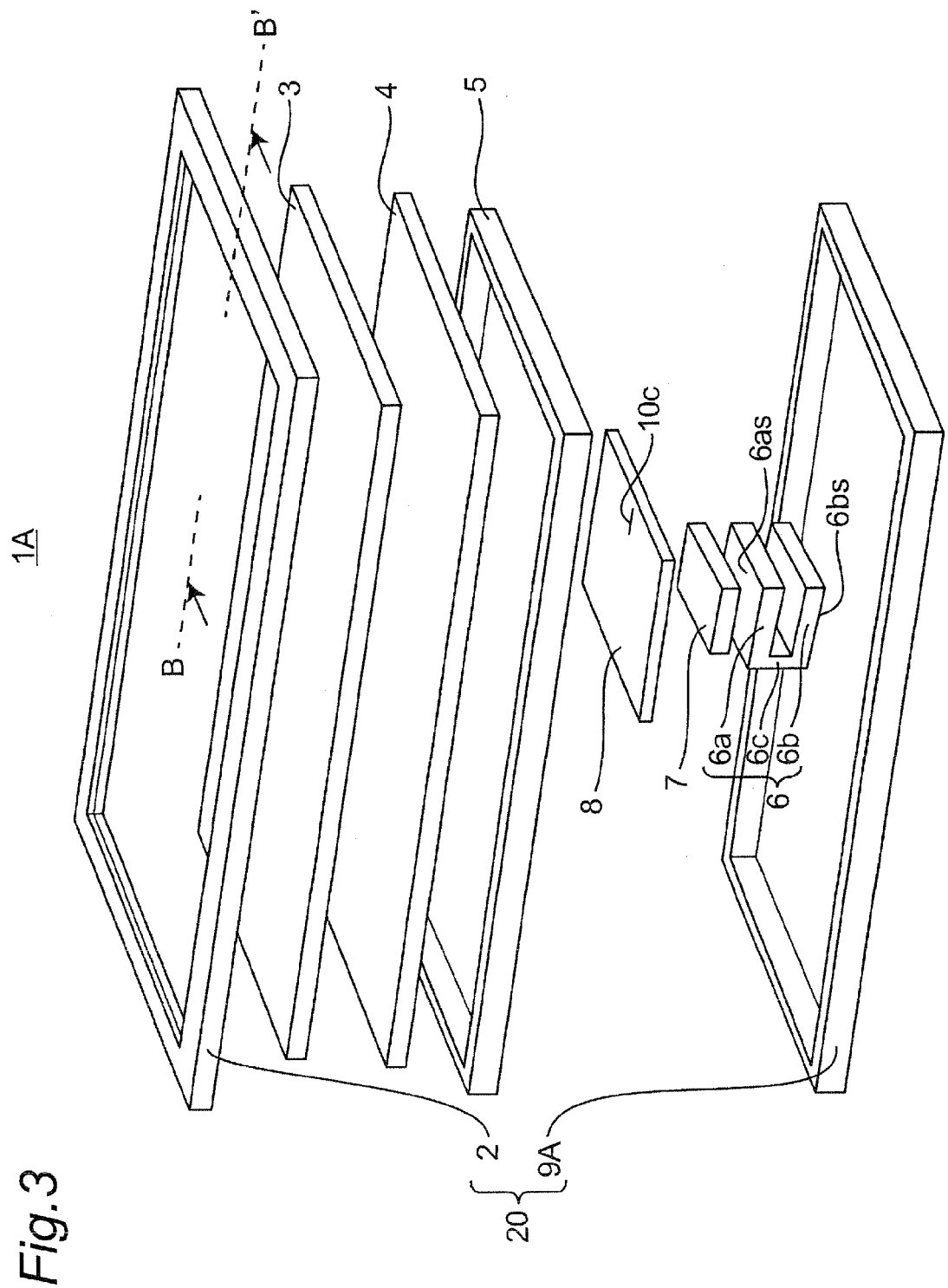
FIG. 3 is an exploded perspective diagram showing a schematic overall configuration of a thin display apparatus 1A according to a second embodiment.

FIG. 3 is an exploded perspective diagram showing a schematic overall configuration of a thin display apparatus 1A according to a second embodiment. The thin display apparatus 1A according to the present embodiment differs from the thin display apparatus 1 according to the first embodiment as follows.

(1) The back cover 9 is replaced by a back cover 9A,
(2) the heat conduction member 7 is provided so as to surface-contact directly with the electronic component 11, and
(3) the heat radiation member 6 is provided between the heat conduction member 7 and the back cover 9A.

Referring to FIG. 3, the thin display apparatus 1A according to the second embodiment is configured to include the liquid crystal display panel 3 of a flat type display panel, the backlight apparatus 4, the circuit substrate 8, which has the plurality of electronic components such as the driver circuit and the memory for displaying the image on the liquid display panel 3. In addition, the metallic chassis 5 is arranged on the back face of the backlight apparatus 4. Further, the heat conduction member 7 and the heat radiation member 6 are arranged on the back side of the circuit substrate 8. The enclosure 20 is configured to include the front cover 2 and the back cover 9A. The liquid crystal display panel 3, the backlight apparatus 4, the metallic chassis 5, the circuit substrate 8, the heat conduction member 7, and the heat radiation Member 6 are accommodated in the enclosure 20. In FIG. 3, for the purpose of easily understanding an overall structure, a structure of each of the elements is shown to be simplified.

Each of the configurations of the front cover 2, the liquid crystal display panel 3, the backlight apparatus 4, the metallic chassis 5, and the circuit substrate 8 are identical with that of the first embodiment, and therefore, there is a case when these descriptions are sometimes omitted.

Referring to FIG. 3, the back cover 9A is configured using metal materials such as a metal, to both sides of which the high radioactive ceramic sheets are adhered, an alumite-treated black metal, a metal, to which the carbon black is applied, and the metal materials having high thermal conductivity and high electrical conductivity. For example, the metal is an alloy including aluminium, iron, and the like as main components. In the present embodiment, as the metallic body for radiating the heat generated by the electronic component 11, the back cover 9A of FIG. 3 is used instead of the metallic chassis 5 of FIG. 1 according to the first embodiment. Accordingly, the enclosure 20 according to the present embodiment includes the metallic body in at least a portion of the enclosure 20.

Each of the arrangement configurations of the circuit substrate 8, the heat radiation member 6, and the heat conduction member 7 according to the present embodiment is described in detail below.

Figure 4:
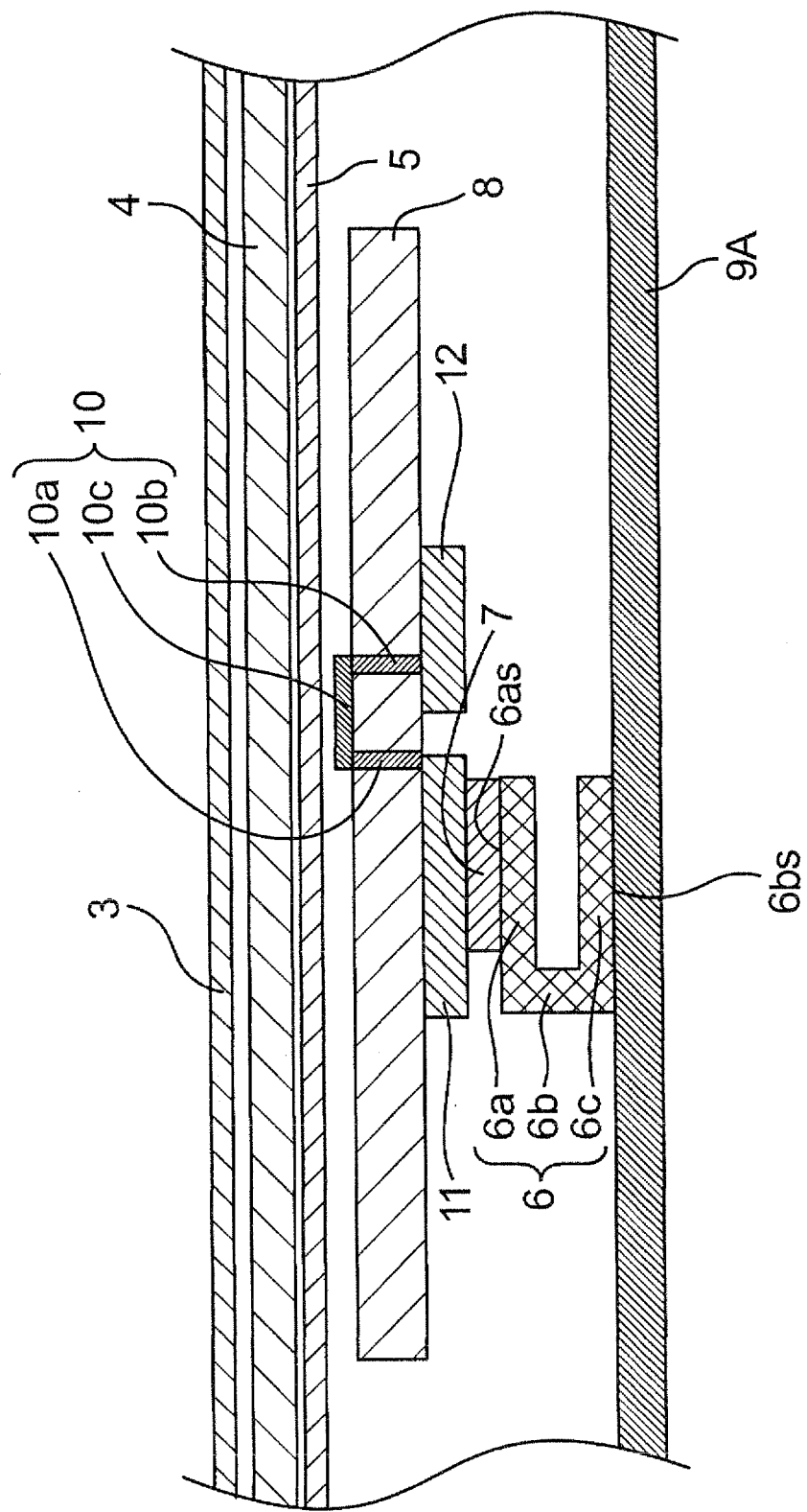
FIG. 4 is a cross-section diagram along B-B' line of the thin display apparatus 1A of FIG. 3.

FIG. 4 is a cross-section diagram along B-B' line of the thin display apparatus 1A of FIG. 3.

Referring to FIG. 4, in the circuit substrate 8, the heat conduction member 7 is joined to the electronic component 11 generating the heat, and the front face of the heat conduction member 7 is surface-contacted with the electronic component 11. The heat conduction member 7 is made to include a material such as a heat radiation rubber and the like. The heat radiation member 6 is made of metallic materials such as aluminium and copper, where the metallic materials have high thermal conductivity and high electrical conductivity.

As illustrated in FIG. 4, the electronic components 11 and 12 are arranged on the back face of the circuit substrate 8. The electronic components 11 and 12 are electrically connected to each other via the wiring conductor 10. As described in the present embodiment, the two electronic components are provided as an example. The thermal amount generated by the electronic component 11 is larger than that of the electronic component 12.

As illustrated in FIG. 4, the heat conduction member 7 is joined to the electronic component 11 arranged on the back face of the circuit substrate 8. The heat radiation member 6 is arranged between the heat conduction member 7 and the back cover 9A. The heat radiation member 6 according to the present embodiment is formed so that the vertical cross-section of the heat radiation member 6 becomes approximately U-shaped like the heat radiation member 6 of FIG. 1 according to the first embodiment. The heat radiation member 6 conducts the heat conducted from the heat conduction member 7 to the back cover 9A.

[2-2. Operation]

Upon activating the thin display apparatus 1A as configured above, the heat radiation of the heat generated by the electronic component 11 and the suppression of the electromagnetic noise radiation from the wiring conductor 10 are described below.

The heat radiation of the heat generated by the electronic component 11 are described. In the present embodiment, the thermal amount generated by the electronic component 11 is relatively large among the electronic components formed on the circuit substrate 8. The front face of the heat conduction member 7 is surface-contacted with the electronic component 11, and therefore, the heat generated by the electronic component 11 is conducted to the heat conduction member 7. That is, the heat conduction member 7, which is joined to the electronic component 11, directly absorbs the heat generated by the electronic component 11 without conducting the heat via the circuit substrate 8. The heat absorbed by the heat conduction member 7 is conducted to the heat radiation member 6, and thereafter, the absorbed heat is radiated from the back cover 9A via the heat radiation member 6.

In the thin display apparatus 1A according to the present embodiment, the suppression of the electromagnetic noise radiation from the wiring conductor 10 is described in order below.

Like the first embodiment, in the present embodiment, the electronic components 11 and 12, and the wiring conductor 10 for connecting the electronic component 11 to the electronic component 12 generate the electromagnetic noise, and therefore, the electronic components 11 and 12, and the wiring conductor 10 become the electromagnetic noise sources. When the heat conduction portion 6c is located near the electromagnetic noise sources, the heat conduction portion 6c is electromagnetically coupled to the electromagnetic noise sources, and therefore, the electromagnetic noise is radiated from the heat radiation member 6. The radiated electromagnetic noise is propagated to the back cover 9A, and therefore, the electromagnetic noise is radiated to the outside of the thin display apparatus 1A. The radiated electromagnetic noise has a negative impact on the thin display apparatus itself and its surrounding devices.

In contrast, the heat radiation member 6 according to the present disclosure is formed so that the vertical cross-section of the heat radiation member 6 becomes approximately U-shaped so as to suppress the electromagnetic coupling to the wiring conductor 10, which is the electromagnetic noise source. That is, the heat conduction portion 6c is provided at the position separated from the wiring conductor 10, that is, the heat conduction portion 6c is provided at the position, which is not close to the wiring conductor 10.

The heat radiation member 6 is configured to include the heat discharge portion 6b having the heat discharge surface 6bs surface-contacted with the back cover 9A, the heat introduction portion 6a having the heat introduction surface 6as surface-contacted with the heat conduction member 7, and the heat conduction portion 6c for conducting from the heat introduction portion 6a to the heat discharge portion 6b.

In heat radiation member 6, in order to suppress the electromagnetic coupling to the wiring conductor 10 generating the electromagnetic noise, the heat conduction portion 6c connects between the heat introduction portion 6a and the heat discharge portion 6b at the position of edge face, which is farthest from the wiring conductor 10, which is an electromagnetic noise generation source. Accordingly, the heat radiation member 6 according to the present embodiment becomes approximately U-shaped. The thin display apparatus 1A is configured as described above, and therefore, the thin display apparatus 1A can suppress the electromagnetic coupling of the heat conduction portion 6c of the heat radiation member 6 to the wiring conductor 10.

[2-3. Advantageous Effects and the Like]

According to the thin display apparatus 1A as configured above, the thin display apparatus 1A is configured to include the back cover 9A, the circuit substrate 8 having the electronic component 11 and the wiring conductor 10, the heat conduction member 7 for absorbing the heat generated by the electronic component 11, and the heat radiation member 6 provided between the back cover 9A and the heat conduction member 7. In addition, the heat radiation member 6 is configured to include the heat introduction portion 6a surface-contacted with the heat conduction member 7, the heat discharge portion 6b surface-contacted with the back cover 9A, and the heat conduction portion 6c for conducting the heat from the heat introduction portion 6a to the heat discharge portion 6b. Further, the heat conduction portion 6c is provided at the position separated from the wiring conductor 10 so as not to electromagnetically couple to the wiring conductor 10.

Accordingly, the thin display apparatus 1A can suppress the electromagnetic coupling of the heat radiation member 6 to the wiring conductor 10 generating the electromagnetic noise. Accordingly, since the electromagnetic noise can be propagated to the heat radiation member 6, the thin display apparatus 1A can suppress the radiation of the electromagnetic noise from the heat radiation member 6. Since the radiated electromagnetic noise can be propagated to the back cover 9A, the thin display apparatus 1A can suppress the radiation of the electromagnetic noise to the outside of the thin display apparatus 1A.

In addition, for radiating the heat, there is a case that only the heat conduction member 7 is used as the heat radiation structure without using the heat radiation member 6. In this case, when a thickness of the heat conduction member 7 is increased in order to efficiently conduct the heat from the heat conduction member 7 to the back cover 9A, there is a possibility that it is difficult to thin the thin display apparatus 1A. In contrast, according to the thin display apparatus 1A using both the heat conduction member 7 and the heat radiation member 6 as the heat radiation structure, as compared with the case using only the heat conduction member 7 as the heat radiation structure, the thin display apparatus 1A can thin the thickness of the heat conduction member 7, and therefore, the thin display apparatus 1A has an advantageous effect of reducing a space for providing the heat conduction member 7 and the heat radiation member 6.

Further, according to the thin display apparatus 1A of the present embodiment, the back cover 9A, which is a portion of the enclosure 20, can be used as the metallic body for radiating the heat. However, the present disclosure is not limited thereto, for example, if the metallic body can be included in a portion of the front cover 9A, in a whole of the enclosure 20 including the front cover 2, or in at least a portion of the enclosure 20, the metallic body may be used for radiating the heat.

Furthermore, the heat conduction member 7 according to the present embodiment is provided directly on the electronic component 11. Accordingly, as compared with the thin display apparatus 1 according to the first embodiment, the thin display apparatus 1A has an advantageous effect of further efficiently radiating the heat.

Third Embodiment

Figure 5:
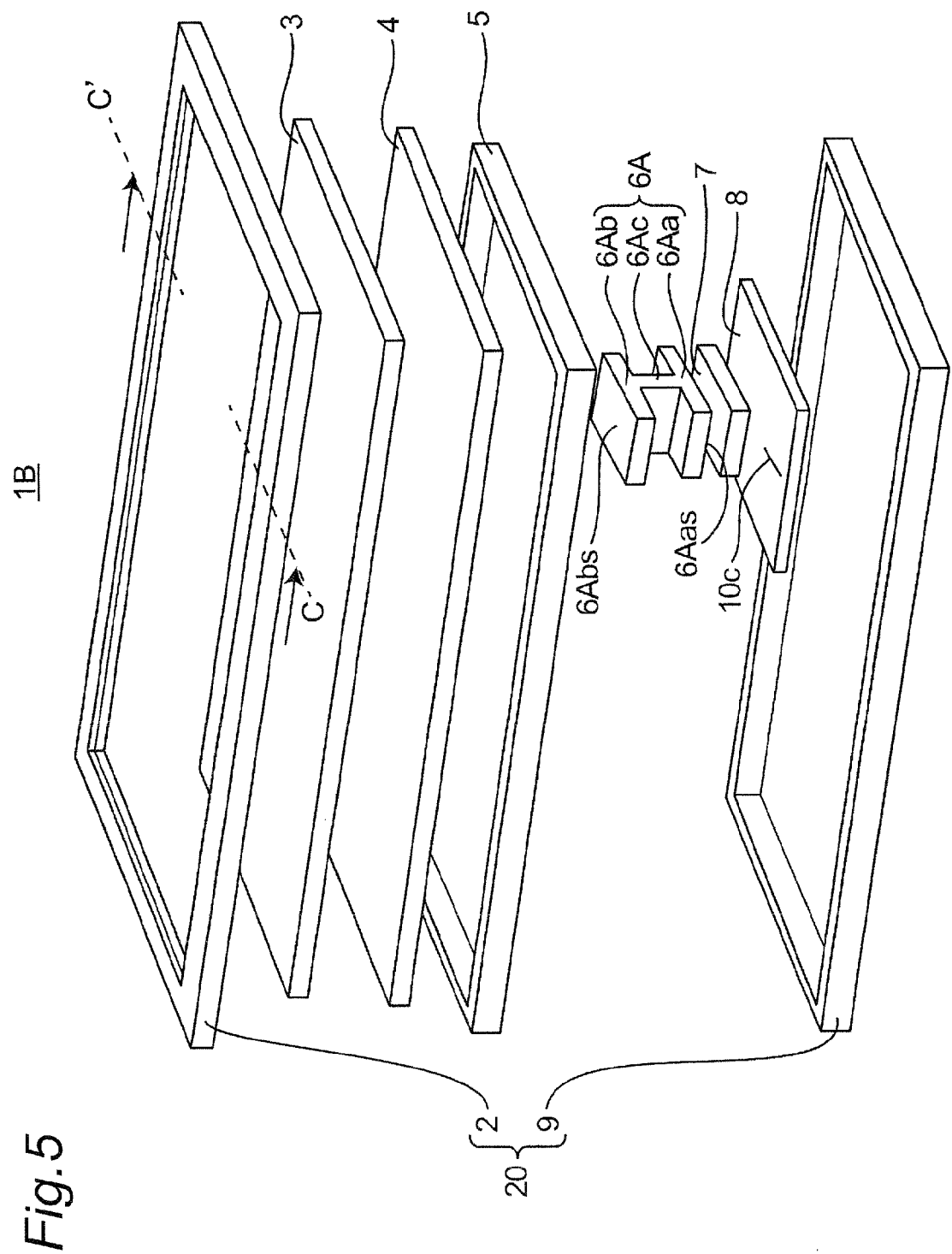
FIG. 5 is an exploded perspective diagram showing a schematic overall configuration of a thin display apparatus 1B according to a third embodiment.

FIG. 5 is an exploded perspective diagram showing a schematic overall configuration of a thin display apparatus 1B according to a third embodiment.

Figure 6:
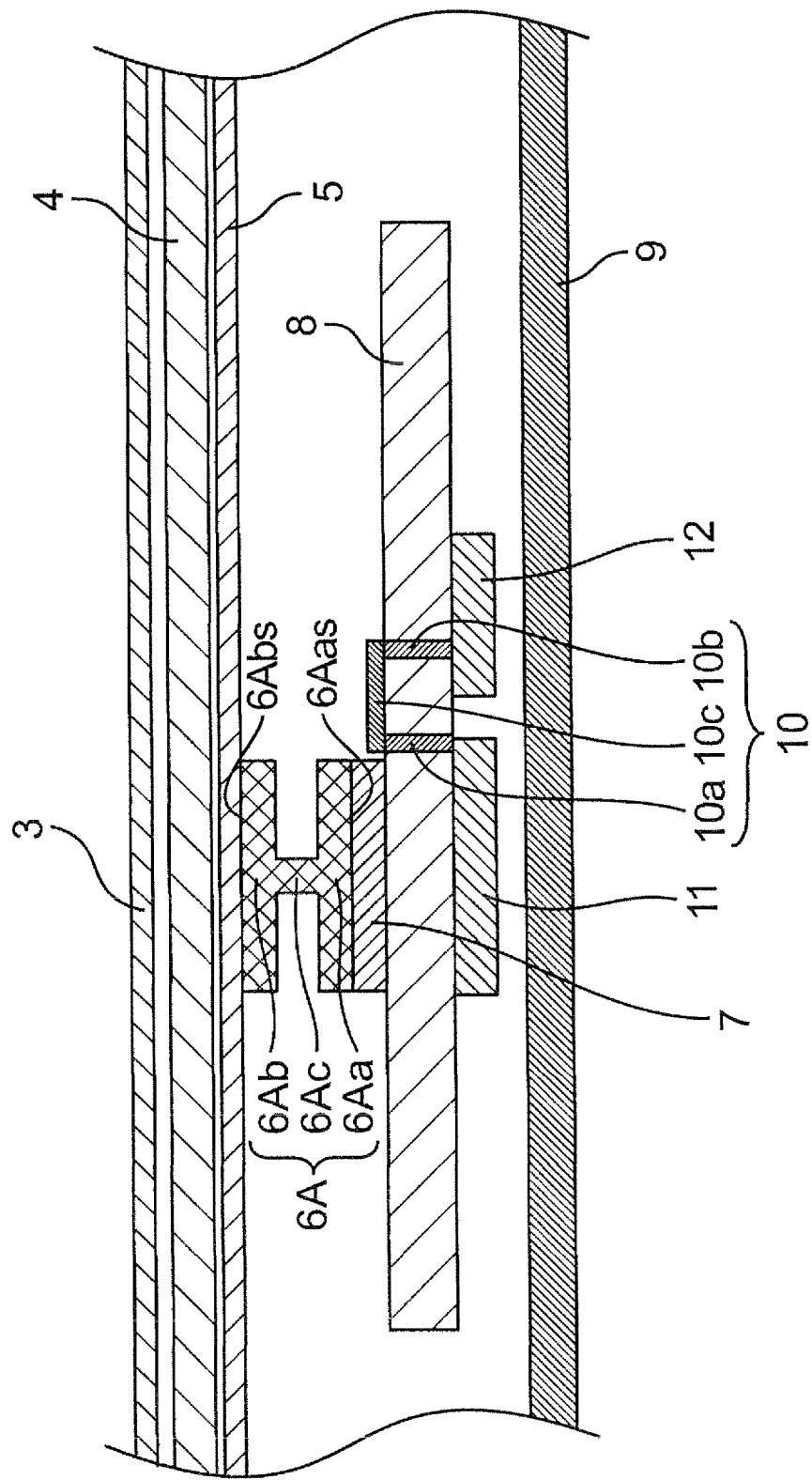
FIG. 6 is a cross-section diagram along C-C' line of the thin display apparatus 1B of FIG. 5.

FIG. 6 is a cross-section diagram along C-C' line of the thin display apparatus 1B of FIG. 5. The thin display apparatus 1B according to the present embodiment differs from the thin display apparatus 1 according to the first embodiment as follows.

(1) The heat radiation member 6 is replaced by a heat radiation member 6A, and
(2) when looking from the upper side of the circuit substrate 8, the circuit substrate 8 is clockwise rotated by 90 degrees.

Referring to FIG. 5, when the heat radiation member 6A is compared with the heat radiation member 6 of FIG. 1 according to the first embodiment, there is such a difference that the heat conduction portion 6c is replaced by a heat conduction portion 6Ac. Additionally, a heat introduction portion 6Aa of the heat radiation member 6A has the same configuration as that of the heat introduction portion 6a of the heat radiation member 6 of FIG. 1 according to the first embodiment, and a heat discharge portion 6Ab of the heat radiation member 6A has the same configuration as that of the heat discharge portion 6b of the heat radiation member 6 of FIG. 1 according to the first embodiment. In this case, a heat introduction surface 6Aas and a heat discharge surface 6Abs correspond to the heat introduction surface 6 as and the heat discharge surface 6bs, respectively. Accordingly, the heat radiation member 6A according to the present embodiment is formed so that the vertical cross-section of the heat radiation member 6A becomes approximately H-shaped as illustrated in FIG. 6. Accordingly, the heat radiation member 6A has a mechanical strength higher than that of the heat radiation member 6 of FIG. 1 according to the first embodiment.

As illustrated in FIG. 6, the heat radiation member 6A is arranged so that the heat conduction portion 6Ac is provided at the position separated from the wiring conductor 10 so as to suppress the electromagnetic coupling to the wiring conductor 10.

According to the thin display apparatus 1B as configured above, the heat conduction portion 6Ac is provided between a side portion facing to the wiring conductor 10 and an opposite side portion to the side portion.

Accordingly, the thin display apparatus 1B according to the present embodiment has the same effect as that of the thin display apparatus 1 of the first embodiment. Further, since the heat radiation member 6A has the mechanical strength higher than that of the heat radiation member 6 of FIG. 1, as compared with the thin display apparatus 1 of FIG. 1 according to the first embodiment, the thin display apparatus 1B has a further advantageous effect of having a high strength.

Fourth Embodiment

Figure 7:
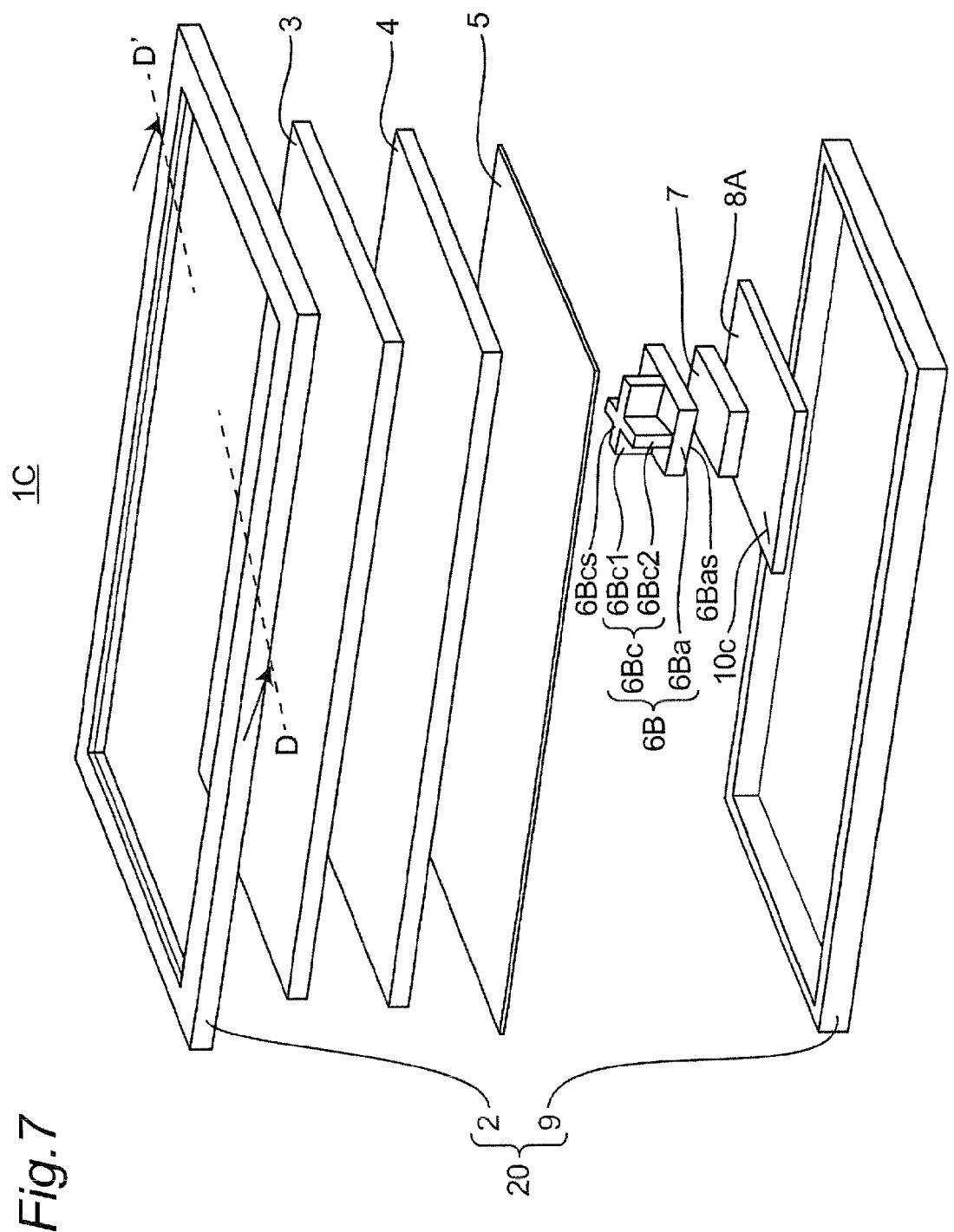
FIG. 7 is an exploded perspective diagram showing a schematic overall configuration of a thin display apparatus 1C according to a fourth embodiment.
Figure 8:
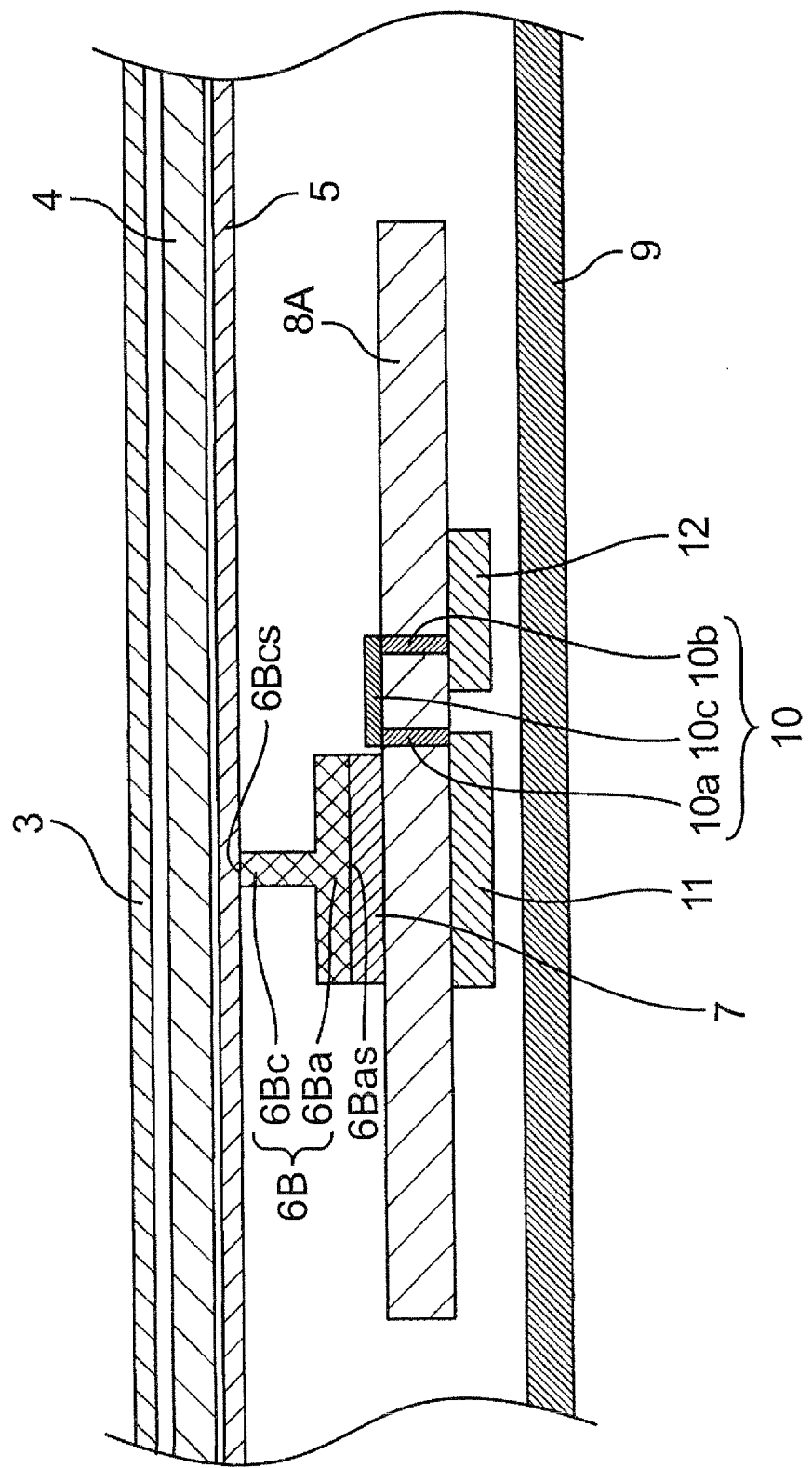
FIG. 8 is a cross-section diagram along D-D' line of the thin display apparatus 10 of FIG. 7.

FIG. 7 is an exploded perspective diagram showing a schematic overall configuration of a thin display apparatus 1C according to a fourth embodiment. FIG. 8 is a cross-section diagram along D-D' line of the thin display apparatus 1C of FIG. 7. The thin display apparatus 1C according to the present embodiment differs from the thin display apparatus 1 of FIG. 1 according to the first embodiment as follows.

(1) The heat radiation member 6 is replaced by a heat radiation member 6B, and
(2) the circuit substrate 8 is replaced by a circuit substrate 8A.

Referring to FIG. 7, the heat radiation member 6B is configured to include a heat introduction portion 6Ba and a heat conduction portion 6Bc. When the heat radiation member 6B is compared with the heat radiation member 6 according to the first embodiment, there is such a difference that the heat conduction portion 6c is replaced by the heat conduction portion 6Bc. The heat conduction portion 6Bc has a heat discharge surface 6Bcs surface-contacted with the back face of the metallic chassis 5. Additionally, the heat introduction portion 6Ba of the heat radiation member 6B has the same configuration as that of the heat introduction portion 6a of FIG. 1. In this case, a heat introduction surface 6Bas of the heat introduction portion 6Ba has the same configuration as that of the heat introduction surface 6as of the heat introduction portion 6a. As compared with the circuit substrate 8 according to the first embodiment, a position of the connection conductor 10c of the wiring conductor 10 of the circuit substrate 8A is different from that of the connection conductor 10c of the circuit substrate 8.

Referring to FIG. 7, the heat conduction portion 6Bc is configured to include a first heat conduction plate 6Bc1 and a second heat conduction plate 6Bc2. Each of the first heat conduction plate 6Bc1 and the second heat conduction plate 6Bc2 has a flat-plate shape perpendicular to the circuit substrate 8A. The first heat conduction plate 6Bc1 and the second heat conduction plate 6Bc2 are arranged to be orthogonal with each other. Accordingly, the heat radiation member 6B is formed so that a horizontal cross-section of the heat conduction portion 6Bc becomes approximately cross-shaped.

The heat conduction portion 6Bc of FIG. 7 serves as a heat discharge portion of the heat radiation member 6B. That is, the heat discharge surface 6Bcs is surface-contacted with the back face of the metallic chassis 5, and therefore, the heat conduction portion 6Bc conducts a heat, which is accumulated by the heat introduction portion 6Ba, to the metallic chassis 5 via the heat discharge surface 6Bcs.

In the circuit substrate 8A of FIG. 7, when a position where the first heat conduction plate 6Bc1 intersects with the second heat conduction plate 6Bc2 is set as a reference position, the wiring conductor 10 is arranged to be inclined at substantially 45 degrees with respect to the first heat conduction plate 6Bc1 and the second heat conduction plate 6Bc2. Accordingly, as illustrated in FIG. 8, the heat radiation member 6B is arranged so that the heat conduction portion 6Bc is provided at the position separated from the wiring conductor 10 so as to suppress the coupling to the wiring conductor 10 generating the electromagnetic noise. That is, the wiring conductor 10 is provided so as to be separated from the first and second heat conduction plates 6Bc1 and 6Bc2. As a result, the wiring conductor 10 suppresses the electromagnetic coupling to the heat conduction portion 6Bc.

According to the thin display apparatus 1C as configured above, the heat conduction portion 6Bc and the heat discharge portion are configured to include the first heat conduction plate 6Bc1 and the second heat conduction plate 6Bc2, each of which has the flat-plate shape perpendicular to the circuit substrate 8A. The first heat conduction plate 6Bc1 and the second heat conduction plate 6Bc2 are configured to be substantially orthogonal with each other. The wiring conductor 10 is provided to be separated from the first and second heat conduction plates 6Bc1 and 6Bc2 so as not to electromagnetically couple to the heat conduction portion 6Bc.

Accordingly, the thin display apparatus 1C according to the present embodiment has the same effect as that of the thin display apparatus 1 of the first embodiment. Further, since the heat radiation member 6B is formed so that the horizontal cross-section of the heat conduction portion 6Bc becomes approximately cross-shaped, as compared with the heat radiation member 6A of FIG. 5 according to the third embodiment, the thin display apparatus 1C has a further advantageous effect of having a high strength.

Other Embodiments

As described above, the first to fourth embodiments are described for illustrating the techniques disclosed in the present application. However, the techniques in the present disclosure are not limited thereto. For example, modifications, replacements, additions, abbreviations can be applied to the above embodiments. In addition, a new embodiment can be made by combining each of the components described in the first to second embodiments.

Then, other embodiment are illustrated as follows.

In the first and third to fourth embodiments, the heat radiation members 6, 6A, and 6B are contacted with the metallic chassis 5, respectively. However, the present disclosure is not limited thereto. For example, each of the heat radiation members 6, 6A, and 6B may be provided to be contacted with the back cover 9. That is, the heat from the electronic component 11, which is absorbed by the heat conduction member 7 via the circuit substrate 8, may be conducted to the back cover 9 via the heat radiation member 6, 6A, or 6B. In this case, the back cover 9 is made of the material, which is identical with that of the back cover 9A according to the second embodiment.

Alternatively, in the first and third to fourth embodiments, the heat conduction member 7 is contacted with the front face of the circuit substrate. Namely, the heat conduction member 7 is contacted with the side face where the electronic components 11 and 12 are not arranged. However, the present disclosure is not limited thereto, for example, the heat conduction member 7 may be arranged to be contacted directly with the electronic component 11. That is, the heat, which is generated in the electronic component 11, is absorbed in the heat conduction member 7 without being conducted to the circuit substrate 8, and thereafter, the heat, which is absorbed in the heat conduction member 7, may be conducted to the metallic chassis 5 via the heat radiation member 6, 6A, or 6B.

In the first and second embodiments, the approximately U-shaped heat radiation member 6 is described as an example of the heat radiation member. In addition, the heat radiation member 6A is described in the third embodiment, where the heat radiation member 6A is formed so that the vertical cross-section of the heat radiation member 6A becomes approximately H-shaped. Further, the heat radiation member 6B is described in the fourth embodiment, where the heat radiation member 6B is provided with the heat conduction portion 6Bc having the approximately cross-shaped horizontal cross-section. When using these heat radiation members 6, 6A, and 6B, each of the heat radiation members 6, 6A, and 6B suppresses the electromagnetic coupling to the wiring conductor 10 generating the electromagnetic noise. However, a shape of the heat radiation member is not limited thereto. The shape of the heat radiation member may be formed so that the heat conduction portion of the heat radiation member is arranged to suppress the electromagnetic coupling to the electromagnetic noise sources such as the wiring conductor 10 and the like.

In addition, in the fourth embodiment, the heat conduction portion 6Bc including the two heat conduction plates 6Bc1 and 6Bc2 is used. However, a number of heat conduction plates is not limited thereto, for example, the heat conduction portion comprised of three or more heat conduction plates may be used. The strength of the heat radiation member can be increased by increasing the number of heat conduction plates.

In the first to fourth embodiments, the heat radiation rubber is described as an example of materials of the heat conduction member 7. When using the heat radiation rubber, the heat generated by the electronic components can be absorbed. However, the heat conduction member is not limited thereto. For example, a heat conductive sheet may be used as the heat conduction member. The thin display apparatus can be thinned by using the heat conductive sheets. That is, the heat conduction member 7 may be replaced by other absorbers, which absorb the heat generated by the electronic components.

As described in the first to fourth embodiments, only the electronic component 11 can radiate the heat. However, the number of electronic components for radiating the heat is not limited to one. For example, as described below with reference to FIG. 9 and FIG. 10, the similar configuration may be applied to two or more electronic components.

Figure 9:
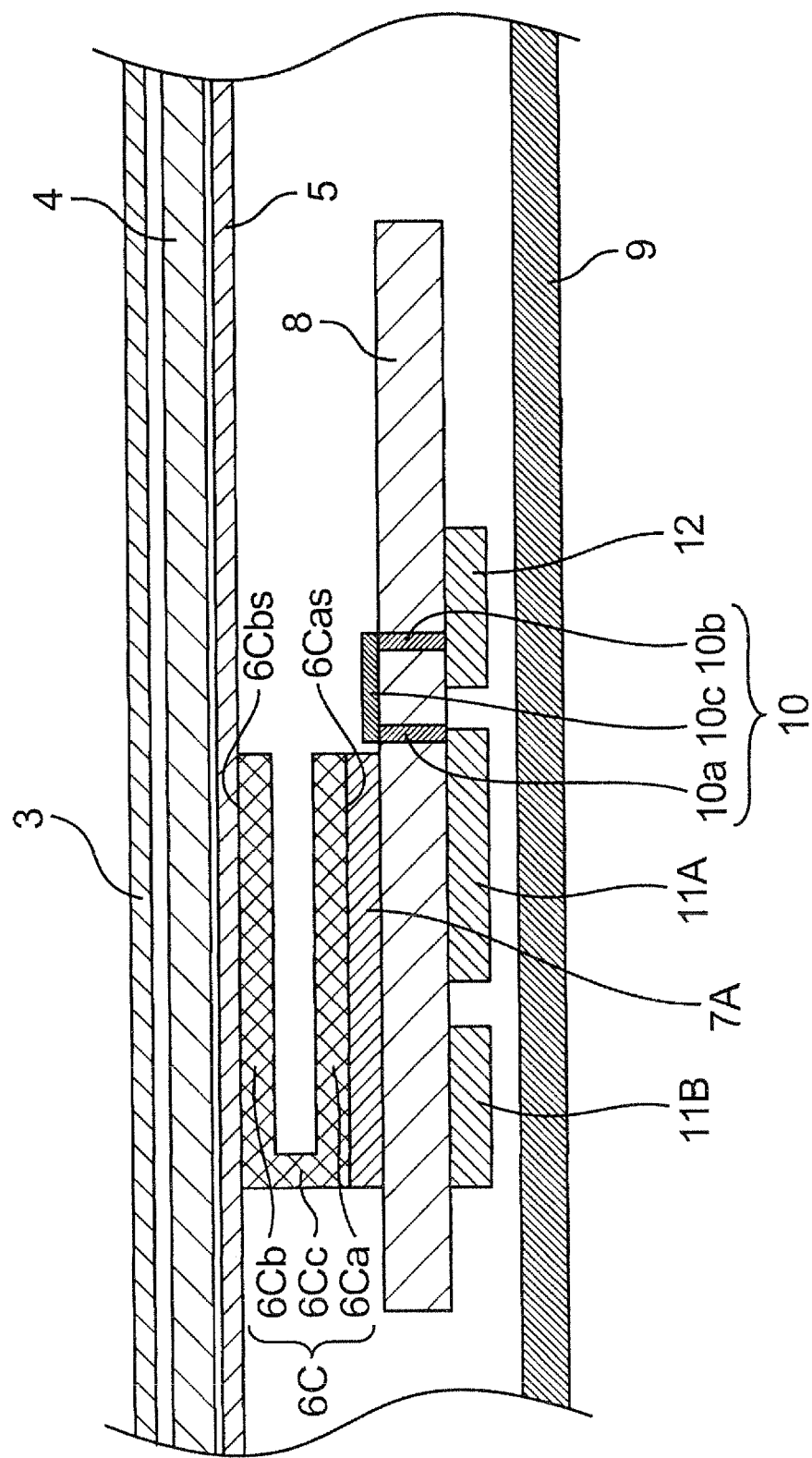
FIG. 9 is a vertical cross-section diagram of a thin display apparatus 1D according to the other embodiment.

FIG. 9 is a vertical cross-section diagram of a thin display apparatus 1D according to the other embodiment. Referring to FIG. 9, two electronic components 11A and 11B, which generate the heat higher than the heat generated by the electronic component 12, are arranged on the back face of the circuit substrate 8. A heat conduction member 7A is arranged in the circuit substrate 8 within an area opposite to an area where the electronic components 11A and 11B are provided. Further, a heat radiation member 6C is provided on a front face of the heat conduction member 7A. The heat radiation member 6C is configured to include a heat introduction portion 6Ca, a heat discharge portion 6Cb, and a heat conduction portion 6Cc. In addition, a heat introduction surface 6Cas is surface-contacted with the front face of the heat conduction member 7A, and the heat discharge surface 6Cb is surface-contacted with the back face of the metallic chassis 5. Accordingly, in case that there are two or three or more electronic components, for example, the heat radiation member 6C and the heat conduction member 7A, which constitute the heat radiation structure of the present disclosure, are provided prior to the electronic components generating a high heat.

FIG. 10 is a vertical cross-section diagram of a thin display apparatus 1E according to the other embodiment. Referring to FIG. 10, two heat radiation members 6 and 6D are used to absorb the heat generated by the electronic components 11 and 12. In this case, the heat radiation member 6D has the same configuration as that of the heat radiation member 6 of FIG. 1 according to the first embodiment. That is, a heat conduction member 7C is arranged in the circuit substrate 8 within an area opposite to an area where the electronic component 12 is provided. Further, the heat radiation member 6D is provided on a front face of the heat conduction member 7C. The heat radiation member 6D is configured to include a heat introduction portion 6Da, a heat discharge portion 6Db, and a heat conduction portion 6Dc. In addition, a heat introduction surface 6Das is surface-contacted with the front face of the heat conduction member 7C, and a heat discharge surface 6Db is surface-contacted with the back face of the metallic chassis 5. As described above, the two heat radiation members 6 and 6D may be arranged on both sides of the one wiring conductor 10.

In the first to fourth embodiments, although the present disclosure is described by illustrating the thin display apparatuses 1, and 1A to 1E, the present disclosure is not limited thereto. The heat radiation structure of the present disclosure can be applied to apparatuses other than the thin display apparatuses 1, 1A to 1E, for example, the heat radiation structure of the present disclosure can be applied to various types of imaging apparatuses such as digital cameras, video cameras, and various electronic devices including optical devices and the like other than the imaging apparatuses. Further, the heat radiation structure of the present disclosure can be applied to components constituting the imaging apparatuses, the optical devices, and the other electronic devices.

As described above, as illustrations of the techniques of the present disclosure, the embodiments are described. Therefore, the accompanying drawings and detailed descriptions are provided.

Accordingly, the components described in the accompanying drawings and detailed descriptions are not always essential components for solving the problems, and therefore, the components, which are not essential for solving the problems, can be included in order to illustrate the techniques as described above. Accordingly, it should not be appreciated that those non-essential components are essential since those non-essential components are described in the accompanying drawings and detailed descriptions.

In addition, since the embodiments as described above are examples for illustrating the techniques of the present disclosure, it is to be noted that various changes such as modifications, replacements, additions, and abbreviations are apparent to those skilled in the art. Such changes are to be understood as included within the scope of the present disclosure as defined by the appended claims and the equivalents thereof.

The present disclosure can be applied to an electronic device having a heat radiation structure. In particular, the heat radiation structure of the present disclosure can be applied to various types of imaging apparatuses such as digital cameras, video cameras, devices constituting the other electronic devices.

What is claimed is:

1. An electronic device comprising:
   a metallic body;
   a circuit substrate having electronic components and wiring conductors that electrically connect between the electronic components;
   a heat conduction member configured to absorb heat generated by the electronic components; and
   a heat radiation member provided between the metallic body and the circuit substrate,
   wherein the heat radiation member comprises
      a heat introduction portion arranged such that a surface of the heat introduction portion is in direct contact with the heat conduction member,
      a heat discharge portion arranged such that a surface of the heat discharge portion is in direct contact with the metallic body, and
      a heat conduction portion configured to conduct the heat from the heat introduction portion to the heat discharge portion,
   wherein the heat conduction portion is provided to be separated from the wiring conductors so as not to electromagnetically couple to the wiring conductors.

2. The electronic device as claimed in claim 1,
   wherein the metallic body includes a metallic chassis configured to hold components accommodated in the electronic device.

3. The electronic device as claimed in claim 1, further comprising an enclosure,
   wherein the metallic body is included in at least a portion of the enclosure.

4. The electronic device as claimed in claim I,
   wherein the electronic components are arranged within an area on a side of the circuit substrate, and the heat conduction member is provided in the circuit substrate within a corresponding area on an opposite side of the circuit substrate.

5. The electronic device as claimed in claim 1,
   wherein the heat conduction member is provided on the electronic components included in the circuit substrate.

6. The electronic device as claimed in claim 1,
   wherein the heat conduction portion is provided between a surface which faces the wiring conductors and a surface which is opposite to the surface which faces the wiring conductors.

7. The electronic device as claimed in claim 1,
   wherein the heat conduction portion and the heat discharge portion are configured to include first and second heat conduction plates, each of the first and second heat conduction plates having a flat-plate shape and being perpendicular to the circuit substrate,
wherein the first and the second heat conduction plates are configured to be substantially orthogonal with each other,
wherein the wiring conductors are provided to be separated from the first and second heat conduction plates so as not to electromagnetically couple to the heat conduction portion.

8. The electronic device as claimed in claim 1, wherein the heat radiation member is provided between the metallic body and the electronic components.

9. The electronic device as claimed in claim 1,
wherein the heat radiation member and the heat conduction member are provided between the metallic body and the circuit substrate.

\* \* \* \* \*